(12) United States Patent
Compton et al.

(10) Patent No.: US 10,531,587 B2
(45) Date of Patent: Jan. 7, 2020

(54) METHOD AND APPARATUS FOR MODULAR POWER DISTRIBUTION

(71) Applicant: GE Aviation Systems Limited, Cheltenham, Gloucestershire (GB)

(72) Inventors: Russell Mark Compton, Droitwich Spa (GB); John Oliver Collins, Cheltenham (GB)

(73) Assignee: GE Aviation Systems Limited, Cheltenham Gloucestershi (GB)

( * ) Notice: Subject to any disclaimer, the term of this patent is extended or adjusted under 35 U.S.C. 154(b) by 0 days.

(21) Appl. No.: 16/074,833

(22) PCT Filed: Mar. 1, 2017

(86) PCT No.: PCT/GB2017/050547
§ 371 (c)(1),
(2) Date: Aug. 2, 2018

(87) PCT Pub. No.: WO2017/149301
PCT Pub. Date: Sep. 8, 2017

(65) Prior Publication Data
US 2019/0069430 A1 Feb. 28, 2019

(30) Foreign Application Priority Data
Mar. 4, 2016 (GB) .................................. 1603780.6

(51) Int. Cl.
*H05K 7/14* (2006.01)
*B64D 41/00* (2006.01)
(Continued)

(52) U.S. Cl.
CPC ....... *H05K 7/1457* (2013.01); *B60R 16/0238* (2013.01); *B64D 35/08* (2013.01);
(Continued)

(58) Field of Classification Search
CPC .................................................. B64D 2221/00
See application file for complete search history.

(56) References Cited

U.S. PATENT DOCUMENTS

| 6,028,865 A | 2/2000 | Rusche |
| 6,392,319 B1 | 5/2002 | Zebermann |

(Continued)

FOREIGN PATENT DOCUMENTS

| EP | 1258957 A1 | 11/2002 |
| WO | 2015124722 A1 | 8/2015 |

OTHER PUBLICATIONS

International Search Report and Written Opinion dated May 12, 2017 which was issued in connection with WO PCT/GB2017/050547 which was filed on Mar. 1, 2017.

(Continued)

*Primary Examiner* — Fritz M Fleming
(74) *Attorney, Agent, or Firm* — McGarry Bair, P.C.

(57) ABSTRACT

A method and apparatus for modular power distribution includes an end module and at least one switching module having a switching module electrical power interface configured to electrically connect to at least one of the end module electrical power interface, to another switching module electrical power interface, or to at least one voltage converter module, and having at least one of a switching element, an input/output connector, a switching module communication interface, or a bus bar connector, wherein the modules are physically secured.

20 Claims, 7 Drawing Sheets

(51) Int. Cl.
*H05K 5/00* (2006.01)
*H05K 5/02* (2006.01)
*H05K 5/03* (2006.01)
*B60R 16/023* (2006.01)
*B64D 35/08* (2006.01)
*H02B 1/21* (2006.01)

(52) U.S. Cl.
CPC ............... *B64D 41/00* (2013.01); *H02B 1/21* (2013.01); *H05K 5/0021* (2013.01); *H05K 5/0247* (2013.01); *H05K 5/03* (2013.01); *B60Y 2200/51* (2013.01); *B64D 2221/00* (2013.01)

(56) References Cited

U.S. PATENT DOCUMENTS

| | | | |
|---|---|---|---|
| 7,615,892 | B2 | 11/2009 | Anghel et al. |
| 9,236,744 | B2 | 1/2016 | Shipley et al. |
| 9,366,182 | B2 | 6/2016 | Rodriguez et al. |
| 9,413,162 | B2 | 8/2016 | Brouwer et al. |
| 2003/0016520 | A1 | 1/2003 | Cooney et al. |
| 2008/0122289 | A1 | 5/2008 | Best et al. |
| 2013/0229050 | A1 | 9/2013 | Shipley et al. |
| 2015/0102659 | A1 | 4/2015 | Liffring et al. |
| 2015/0102660 | A1 | 4/2015 | Shander et al. |
| 2015/0102661 | A1 | 4/2015 | Shander et al. |
| 2015/0102662 | A1 | 4/2015 | Walstrom et al. |
| 2015/0102663 | A1 | 4/2015 | Brouwer et al. |
| 2015/0173254 | A1 | 6/2015 | Rodriguez et al. |
| 2016/0122033 | A1 | 5/2016 | Liffring et al. |
| 2016/0211673 | A1 | 7/2016 | Krenz et al. |
| 2019/0052081 | A1* | 2/2019 | Rainbow .................. H02J 3/14 |

OTHER PUBLICATIONS

Great Britain Search Report and Written Opinion dated Sep. 5, 2016 which was issued in connection with GB 1603780.6 which was filed on Mar. 4, 2016.

\* cited by examiner

METHOD AND APPARATUS FOR MODULAR POWER DISTRIBUTION

CROSS-REFERENCE TO RELATED APPLICATIONS

The present application claims the benefit of U.K. Patent Application No. 1603780.6, filed Mar. 4, 2016, which is incorporated by reference herein in its entirety.

BACKGROUND OF THE INVENTION

Electrical power systems, such as those found in an aircraft power distribution system, employ power generating systems or power sources, such as generators, for generating electricity for powering electrical loads, such as loads in the systems and subsystems of an aircraft. As the electricity traverses electrical bus bars to deliver power from power sources to electrical loads, power distribution nodes dispersed throughout the power system ensure that power delivered to the electrical loads meets the designed power criteria for the loads. Power distribution nodes can, for instance, further provide step-up or step-down power conversion, direct current (DC) to alternating current (AC) power conversion or AC to DC power conversion, or switching operations to selectively enable or disable the delivery of power to particular electrical loads, depending on, for example, available power distribution supply, criticality of electrical load functionality, or aircraft mode of operation, such as take-off, cruise, or ground operations.

Typical power distribution nodes include one or more rack assemblies for including, for example, a number of electronic cards to provide for the aforementioned conversions or switching functions. The rack assemblies are not typically optimized to be contained within the smallest configurable installation volume, leading to rack assemblies larger than necessary, and unused or underutilized components.

BRIEF DESCRIPTION ON THE INVENTION

In one aspect, the disclosure relates to a modular power distribution apparatus including a first end module and a second end module, at least one of the first or second end modules having at least one of an end module communication interface, a power supply, or a processor, at least one switching module having a switching module electrical power interface configured to electrically connect to another switching module electrical power interface, and having at least one of a switching element, an input/output connector, a switching module communication interface, or a bus bar connector, and at least one voltage converter module having an electrical power interface configured to electrically connect to at least one switching module electrical power interface, another voltage converter module electrical power interface, or a bus bar connector. At least a subset of the first end module, the second end module, the at least one switching module, and the at least one voltage converter module have an attachment interface configured to physically secure the at least one switching module and the at least one voltage converter module to and between the first end module and the second end module, or to another switching module or voltage converter module, with the at least one of the first or second end modules communicatively connected to the at least one switching module, and at least one of the switching element, input/output connector, the switching module communication interface, or the bus bar connector being selectively connected to at least one of the first end module, the second end module, another switching module, or the voltage converter module.

In another aspect, the disclosure relates to a modular power distribution apparatus including at least one first end module and at least one second end module, at least one of the first and second end modules having at least one of an end module communication interface or a processor, at least one switching module having a switching module electrical power interface configured to electrically connect to at least another switching module electrical power interface, and having at least one of a switching element, an input/output connector, a switching module communication interface, or a bus bar connector, and at least one voltage converter module having a voltage converter module electrical power interface to connect to at least another voltage converter power interface, at least one switching module electrical power interface, or a bus bar connector. The first end module, the second end module, the at least one switching module, and the at least one voltage converter module have an attachment interface configured to physically secure the at least one switching module to at least one of the first or second end modules, between the first end module and the second end module, or to another switching module or voltage converter module, in one or more axes.

In yet another aspect, the disclosure relates to a method of distributing power in an aircraft, the method including connecting at least one first end module having at least one of an end module communication interface, a power supply, or a processor to a at least one switching module having a switching module electrical power interface and having at least one of a switching element, an input/output connector, a switching module communication interface, or a bus bar connector by connecting the end module communication interface to the switching module communication interface, connecting the at least one voltage converter module to the at least one other switching module having a voltage converter module electrical power interface by connecting the switching electrical power interface to the voltage converter module electrical power interface, connecting at least one second end module to the at least one voltage converter module or at least one other switching module, physically attaching in one or two axes the at least one first end module to the at least one switching module, and the at least one switching module to the at least one voltage converter module, and the at least one voltage converter module or at least one other switching module to the at least one second end module by way of an attachment interface, and connecting the at least one switching module to a power source.

DETAILED DESCRIPTION

Figure 1:
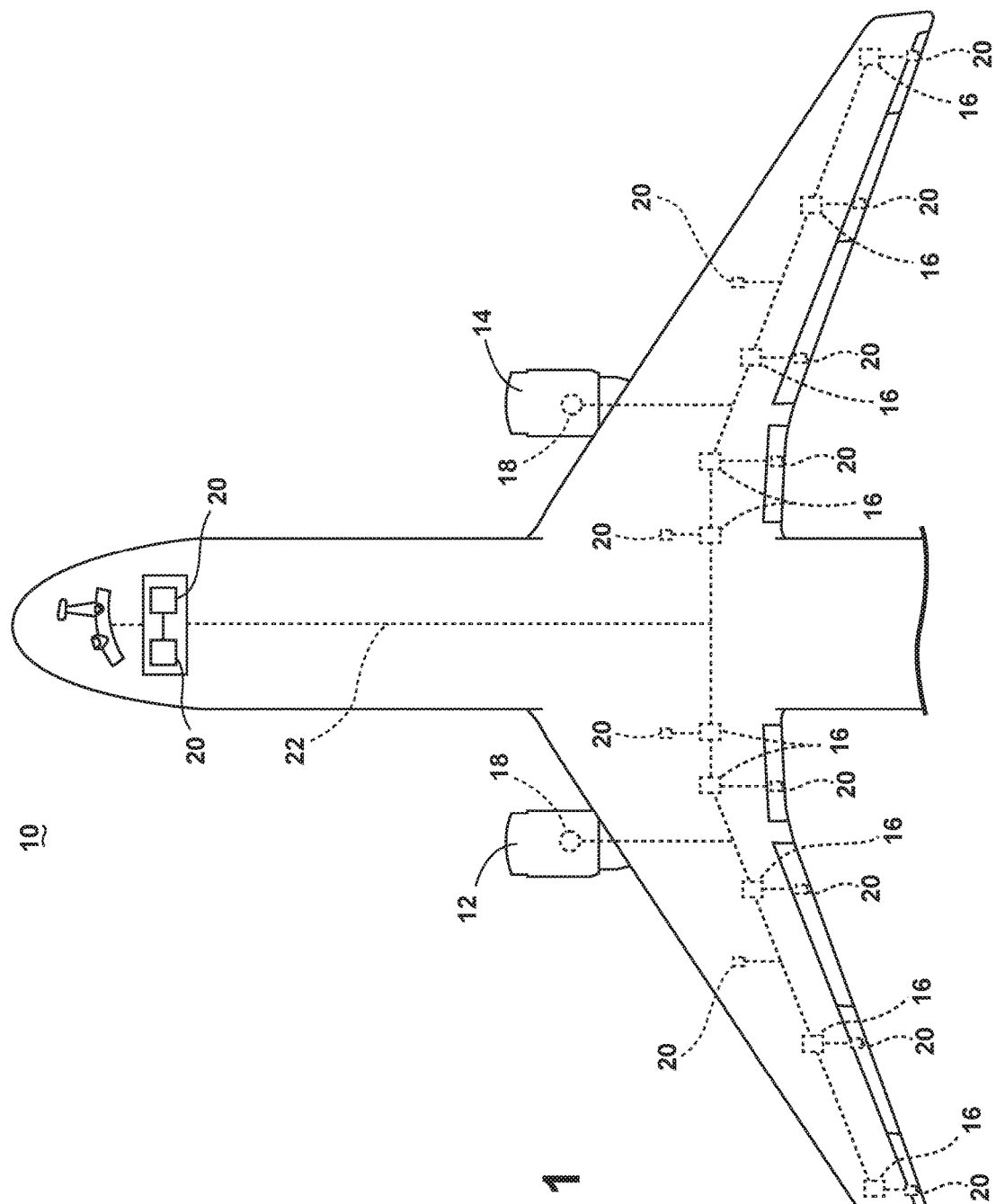
FIG. 1 is a top down schematic view of the aircraft and power distribution system of an aircraft in accordance with various aspects described herein.

The described aspects of the present disclosure are directed to a method and apparatus associated with a modular power distribution apparatus. One example environment where such a method and apparatus can be used includes, but is not limited to, a power distribution system for an aircraft. While this description is primarily directed toward a power distribution system for an aircraft, it is also applicable to any environment using a nodal-based power distribution system where input power is received, acted upon (if necessary), e.g., converted or modified, and distributed to one or more electrical loads.

While "a set of" various elements will be described, it will be understood that "a set" can include any number of the respective elements, including only one element. The use of the terms "proximal" or "proximate" to an element refers to a component being relatively closer to the element as compared to another component. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus. The exemplary drawings are for purposes of illustration only and the dimensions, positions, order and relative sizes reflected in the drawings attached hereto can vary.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as an electric machine or a generator 18. The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22 or bus bars, and power distribution nodes 16. It will be understood that the illustrated aspect of the disclosure of FIG. 1 is only one non-limiting example of a power distribution system, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the transmission lines 22, which delivers the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. The power distribution nodes 16 are shown selectively coupled with a single electrical load 20 for ease of illustration and understanding. Aspects of the disclosure can include power distribution nodes 16 that are selectively coupled with a set of electrical loads 20, wherein a power distribution node 16 can selectively enable or disable the delivery of power to individual or a subset of the electrical loads 20, as described herein. Additionally, all or a subset of the power distribution nodes 16 can be further interconnected (not shown) in order to provide redundant power supply in the event of malfunction or failure of a single node 16.

Additional management functions can be included. Furthermore, additional power sources for providing power to the electrical loads 20, such as emergency power sources, ram air turbine systems, starter/generators, or batteries, can be included, and can substitute for the power source. It will be understood that while one aspect of the disclosure is shown in an aircraft environment, the disclosure is not so limited and has general application to electrical power systems in non-aircraft applications, such as other mobile applications and non-mobile industrial, commercial, and residential applications.

Figure 2:
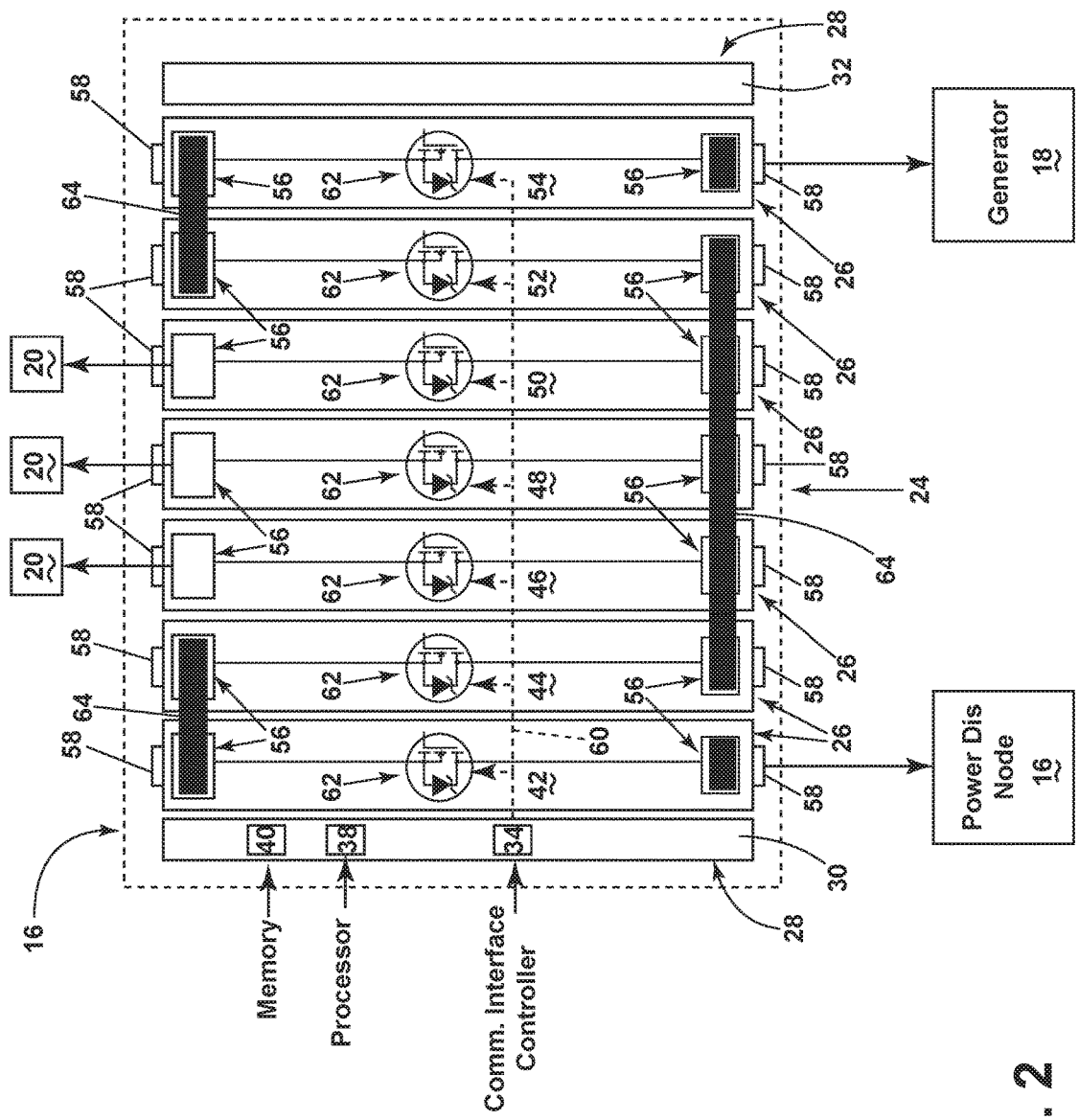
FIG. 2 is a schematic view of a power distribution node of the aircraft and power distribution system of FIG. 1, in accordance with various aspects described herein.

FIG. 2 schematically illustrates a power distribution node 16 of FIG. 1. As shown, the power distribution node 16 can include a modular power distribution apparatus 24 or modular power distribution assembly having a set of switching modules 26 between one or more end modules 28. In the illustrated aspect, the power distribution node 16 includes a first end module 28, shown as a common control module 30, and an opposing second end module 28, which can include an end plate 32 or physical cover. The common control module can further include a set of subcomponents or subsystems including, but not limited to a communication interface controller 34, a processor 38, and memory 40.

In one non-limiting aspect of the power distribution node 16, the set of switching modules 26 can include a first switching module 42, a second switching module 44, a third switching module 46, a fourth switching module 48, a fifth switching module 50, a sixth switching module 52, and a seventh switching module 54. Aspects of the disclosure can be included wherein each in the set of switching modules 26 are substantially alike, that is, of similar construction and composition. Alternatively, the set of switching modules 26 can include at least two subsets of similar constructions and compositions. The similarity of the set of switching modules 26 can enable faster, easier, or more efficient maintenance operations.

The individual switching modules 42, 44, 46, 48, 50, 52, 54 are shown in a common physical alignment, for example, where the longitudinal direction of the set of switching modules 26 is parallel to adjacent switching modules 26, or wherein the set of switching modules 26 is arranged serially, or in series. Each module 42, 44, 46, 48, 50, 52, 54 of the set of switching modules 26 can include at least one switching module electrical power interface 56, at least one input/output connector 58, a switching module communication interface 60, and a switching element 62.

In one non-limiting example, each module 42, 44, 46, 48, 50, 52, 54 can include two electrical power interfaces 56 that are schematically illustrated at opposing longitudinal ends of the module 42, 44, 46, 48, 50, 52, 54. Likewise, in another non-limiting example, each module 42, 44, 46, 48, 50, 52, 54 can include two input/output connectors 58 that are schematically illustrated at opposing longitudinal ends of the module 42, 44, 46, 48, 50, 52, 54. The switching module communication interface 60 of each respective module 42, 44, 46, 48, 50, 52, 54 can collectively define a common control interface 60, which can be further communicatively coupled with the communication interface controller 34 of the common control module 30.

At least a subset of the input/output connectors 58 can be individually electrically coupled with at least one electrical load 20. For example, the third, fourth, and fifth switching modules 46, 48, 50 are each shown having an electrical load 20 coupled with the corresponding switching element 62 via a corresponding input/output connector 58. While only a single input/output connector 58 is coupled with a subset of the switching modules 26, non-limiting aspects of the disclosure can be included wherein a switching module 26 can include a set of input/output connectors 58, or wherein a set of electrical loads 20 are electrically coupled with a single input/output connector 58. Stated another way, a single switching module 26 can include a set of electrically coupled electrical loads 20 and set of input/output connectors 58. Aspects can further be included wherein the switching module 26 can include a switching element 62 corresponding to each input/output connector 58.

Aspects of the switching element 62 can include an electrical switch, such as a solid state power controller, a solid state switch, or a transistor, such as a silicon carbide (SiC) or Gallium Nitride (GaN) based, high bandwidth power switch. SiC or GaN can be selected based on their solid state material construction, their ability to handle large power levels in smaller and lighter form factors, and their high speed switching ability to perform electrical operations very quickly. Additional non-limiting examples of the switching element 62 can include non-polar switching elements 62. Yet additional non-limiting examples of the solid state switch can comprise silicon-based power switches, also capable of high speed switching.

The electrical power interface 56 can be configured to, for example, electrically couple the switching element 62 of the respective module 42, 44, 46, 48, 50, 52, 54 to the at least one input/output connector 58 of the same module 42, 44, 46, 48, 50, 52, 54. Additionally, or alternatively, the electrical power interface 56 can be configured to receive a conductor 64, such as a bus bar connector. The conductor 64 can be selected to enable, for instance, an electrical connection between the electrical power interface 56 of the respective module 42, 44, 46, 48, 50, 52, 54 to at least one electrical power interface 56 of another module 42, 44, 46, 48, 50, 52, 54. For instance, as shown, one conductor 64 electrically connects respective electrical power interfaces 56 between the first and second switching modules 42, 44. Likewise, another conductor 64 electrically connects respective electrical power interfaces 56 between the second, third, fourth, fifth, and sixth switching modules 44, 46, 48, 50, 52. Length of the conductor 64 can be selected based on the desired configuration, that is, the desired electrical coupling of the set of modules 26. Additionally, configurations of the electrical power interfaces 56 or conductors 64 can be selected wherein, for instance, the input/output connector 58 can be electrically coupled with the respective switching element 62 with or without a conductor 64.

While not illustrated, aspects of the switching modules 26 can optionally include additional power electronics components configured, for example, to provide or enable power conversion operations (e.g. AC to DC conversion, DC to AC conversion, a first DC power to a second DC power, etc.) to selectively enable or disable the delivery of power to one or more particular electrical loads 20, depending on, for example, available power distribution supply, criticality of electrical load functionality, or aircraft mode of operation, such as take-off, cruise, or ground operations.

Aspects of the power distribution node 16 or the power distribution apparatus 24 can be selectively or electrically coupled to additional power elements of the aircraft 10. For example, the first switching module 42 is shown further electrically coupled with another power distribution node 16, by way of the transmission line received at an input/output connector 58. Also shown, the seventh switching module 54 can be electrical coupled with a generator 18, by way of the transmission line 22 received at an input/output connector 58. While a respective power distribution node 16 and generator 18 are shown, aspects of the disclosure can include an input/output connector 58 electrically coupled with another power distribution node 16, a set of power distribution nodes 16, or at least one power-supplying element, such as the generator 18, auxiliary power generator, emergency power supply, or combination thereof.

If another power distribution node 16 or the generator 18 supplies power to the power distribution node 16 or the power distribution apparatus 24, the input/output connector 58 can be operating as an input connector 58 to receive the supplied power. Conversely, if the input/output connector 58 is supplying power to another power distribution node 16 or to the generator 18 (e.g. for starting operations of a starter/generator), then the connector 58 is operating as an output connector 58 to deliver the power. Aspects of the disclosure can include operating the power distribution node 16, the power distribution apparatus 24, the switching element 62, or a combination thereof, such that the input/output connector 58 operably switches between receiving input power or supplying output power, for example, to load or to balance current or to provide power redundancies between power sources and electrical loads 20.

The common control module 30 or processor 38 can be configured to control the effective operation of the power distribution node 16 or power distribution apparatus 24. In this sense, the common control module 30 or processor 38 can operably control the set of switching modules 26 to selectively enable or disable a supply of power to traverse a first electrical connection (i.e. a first powered or "hot" electrical power interface 56 or input connector 58), to another electrical connection (i.e. the opposing electrical power interface 56 or output connector 58). The common control module 30 or processor 38 operably controls the set of switching modules 26 by selectively operating the respective switching elements 62 by way of the communication interface controller 34 and communication interface 60. Aspects of the disclosure can be included wherein the processor 38 can include the communication interface controller 34.

The memory 40 of the common control module 30 can store a set of operational control profiles or programs for configuring or operating the power distribution node 16, the power distribution apparatus 24, or a combination thereof. The memory 40 can include random access memory (RAM), read-only memory (ROM), flash memory, or one or more different types of portable electronic memory, such as discs, DVDs, CD-ROMs, etc., or any suitable combination of these types of memory. The common control module 30 or processor 38 can be operably coupled with the memory 40 such that one of the common control module 30 and the memory 40 can include all or a portion of a computer program having an executable instruction set for controlling the operation of the aforementioned components, or a method of operating the same. The program can include a computer program product that can include machine-readable media for carrying or having machine-executable instructions or data structures stored thereon. Such machine-readable media can be any available media, which can be accessed by a general purpose or special purpose computer or other machine with a processor. Generally, such a computer program can include routines, programs, objects, components, data structures, algorithms, etc., that have the technical effect of performing particular tasks or implement particular abstract data types.

Machine-executable instructions, associated data structures, and programs represent examples of program code for executing the exchange of information as disclosed herein. Machine-executable instructions can include, for example, instructions and data, which cause a general purpose computer, a special purpose computer, the common control module 30, or special purpose processing machine to perform a certain function or group of functions. In implementation, the functions can be converted to a computer program comprising a set of executable instructions, which can be executed by the processor 38.

Thus, the common control module 30 or the processor 38 can be configured to effectively control the operation of the set of modules 26 (for instance, by way of the communication interface controller 34 or the communication interface 60) by independently controlling the corresponding set of switching elements 62 of the modules 26. In this sense, the individual switching elements 62 of the set of modules 26 can independently control enabling or disabling a power supply to the coupled electrical load 20. An example of the aforementioned configuration and control can be instructive. In the illustrated example of the third switching module 46, if the conductor 64 extending between the second, third, fourth, fifth, and sixth switching modules 44, 46, 48, 50, 52 is supplying power to the third switching module 46, that power can be selectively supplied to the electrical load 20 by way of the input/output connector 58 electrically opposite the switching element 62. At least one of the common control module 30, the processor 38, or the communication interface controller 34 operably controls the independent operation of the switching element 62 of the third switching module 46 by way of the communication interface 60. In aspects wherein a switching module 26 includes a set of input/output connectors 58 and a corresponding set of switching elements 62, power can be independently or selectively supplied to the set of input/output connectors 58 by operably controlling each corresponding switching element 62 by way of the communication interface 60.

As illustrated, the first and second switching modules 42, 44 having non-polar switching elements 62 can further be collectively operated as a bi-directional or bi-polar switch. As shown, the first switching module 42 is coupled at an input/output connector 58 with a power distribution node 16, and the opposed (i.e. across the switching element 62) electrical power interface 56 is electrically coupled with the proximate electrical power interface 56 of the second switching module 44 by a conductor 64. The second switching module 44 is then configured with a conductor 64 in the opposed (i.e. across the switching element 62) electrical power interface 56, wherein the conductor 64 is further electrically coupled with a subset of the switching modules 46, 48, 50, 52.

In this configuration the first and second switching modules 42, 44 can be operated by way of the communication interface 60 to selectively enable or disable power coupling with another power distribution node 16. In a first example, if the other power distribution node 16 is supplying power to the power distribution apparatus 24, the first and second switching modules 42, 44 can be operated to enable the power supply to traverse across the switching element 62 of the first switching module 42, across the conductor 64 electrically coupling the first and second switching modules 42, 44, and across the switching element 62 of the second switching module 44 to effectively energize or provide an electronic power distribution supply bus to the subset of switching modules 46, 48, 50. The subset of switching modules 46, 48, 50 can then effectively provide the selective energizing or selective power supplying for the set of electrical loads 20, as described herein. In this configuration, the power distribution apparatus 24 can selectively decouple the other power distribution node 16 by way of selectively opening either of the switching elements 62 of the first or second switching module 42, 44.

In the non-limiting illustrated aspect, the sixth and seventh switching modules 52, 54 can be similarly configured as a bi-directional or bi-polar switch to provide selective power or electrical access from the generator 18 to the third, fourth, and fifth switching modules 46, 48, 50. It is further understood that the combination of the first bi-directional switch (i.e. the first and second switching modules 42, 44) and the second bi-directional switch (i.e. the sixth and seventh switching modules 52, 54) can selectively pass power through the power distribution apparatus 24 to the other power distribution node 16 or to the generator 18 to provide redundancy in the power distribution network or electronic distribution bus of the aircraft 10, as explained above.

Figure 3:
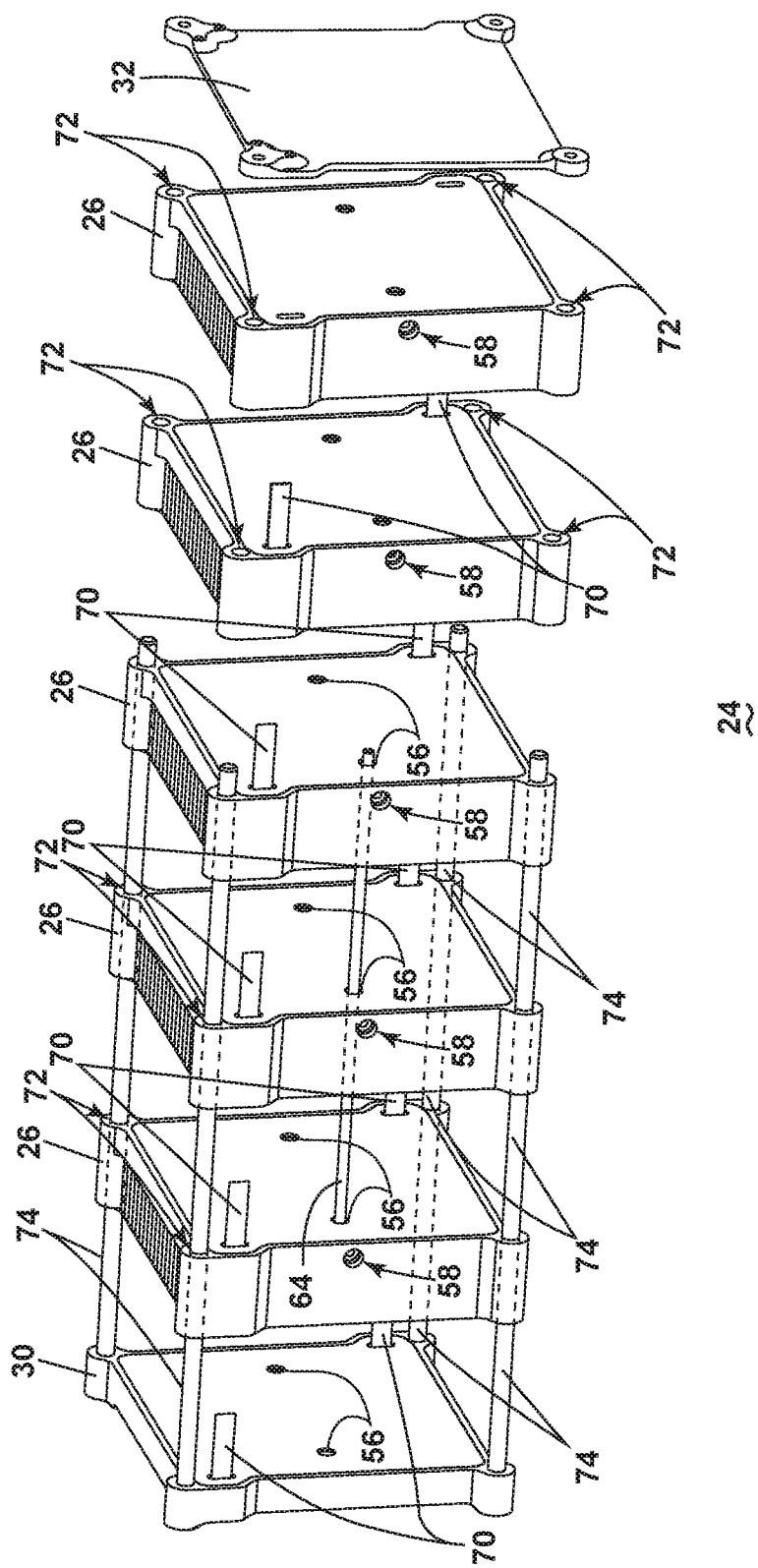
FIG. 3 is an exploded isometric view of a power distribution apparatus for a power distribution node in accordance with various aspects described herein.

FIG. 3 illustrates a non-limiting isometric view of an aspect of the disclosure wherein the power distribution apparatus 24 is exploded to illustrate a portion of the interconnection between the common control module 30 and the set of switching modules 26. As shown, each of the common control module 30 and the set of switching modules 26 can include at least one communicative bus tab 70 that extends normally from the respective module 30, 26 to be received in an corresponding communication bus slot (not shown) in the adjacent module 26. Collectively, the communicative bus tabs 70 operably define the communication interface 60, as explained above. In this sense, each communication bus tab 70 and corresponding communication bus slot can be configured to enable communication with each of the configured modules 26, 30, including transmission and receiving of data packets, data messages, operable instructions, and the like.

As shown, the modules 26, 30 can include a set of communicative bus tabs 70 (and correspondingly, communicative bus slots) to provide or define a set of communication interfaces 60, to provide redundancy in the communication interface 60, or wherein a first communicative interface 60 provides a different functionality than the second communicative interface 60 (e.g. the first sends data, whereas the second returns data, etc.). Additional non-limiting aspects of the disclosure can be included wherein the communicative bus tabs 70 can be selectively removed where they are unnecessary or not needed to further the communication interface 60 with the next adjacent module or element, such as the end plate 32.

FIG. 3 further illustrates a conductor 64 that can be configured or selected to extend between a predetermined subset of the modules 26, 30 of the power distribution apparatus 24. The non-limiting illustrated aspect of FIG. 3 additionally illustrates an attachment interface 72, for example a set of attachment points, similarly located on each of the modules 26, 30. As shown, the attachment interface 72 can be size, shaped, configured, in registry, or the like, to receive a common attachment 74, such as a rod configured to physically secure the power distribution apparatus 24 together.

A single common attachment 74 is illustrated for understanding, but aspects of the disclosure can include a set of common attachments 74, as needed. For example, a set of attachments 74 can be included wherein each individual attachment physically secures a subset of at least two adjacent modules 26, 30 together. Aspects of the disclosure can further be included wherein the modules 26, 30 are configured in alternative geometric shapes beyond square-like configurations (e.g. circular, triangular, trapezoidal, etc.). In such alternative configurations, the locations of the attachment interface 72 or common attachments 74 can be correspondingly located at corners, one or more axes, or positions relative to the geometric configuration such that the power distribution apparatus 24 can be physically secured together, as described herein. Alternative non-limiting aspects of the disclosure can be included wherein the attachment interface 72 and common attachment 74 are configured with mechanical securing mechanisms, such as corresponding screw interfaces, to enable the securing of the power distribution apparatus 24. Alternative securing mechanisms can be included. For example, at least one of the attachment interface 72 or the common attachment 74 can include a locating pin for physically securing purposes or alignment purposes, or a seal between adjacent modules 26, 30.

Figure 4:
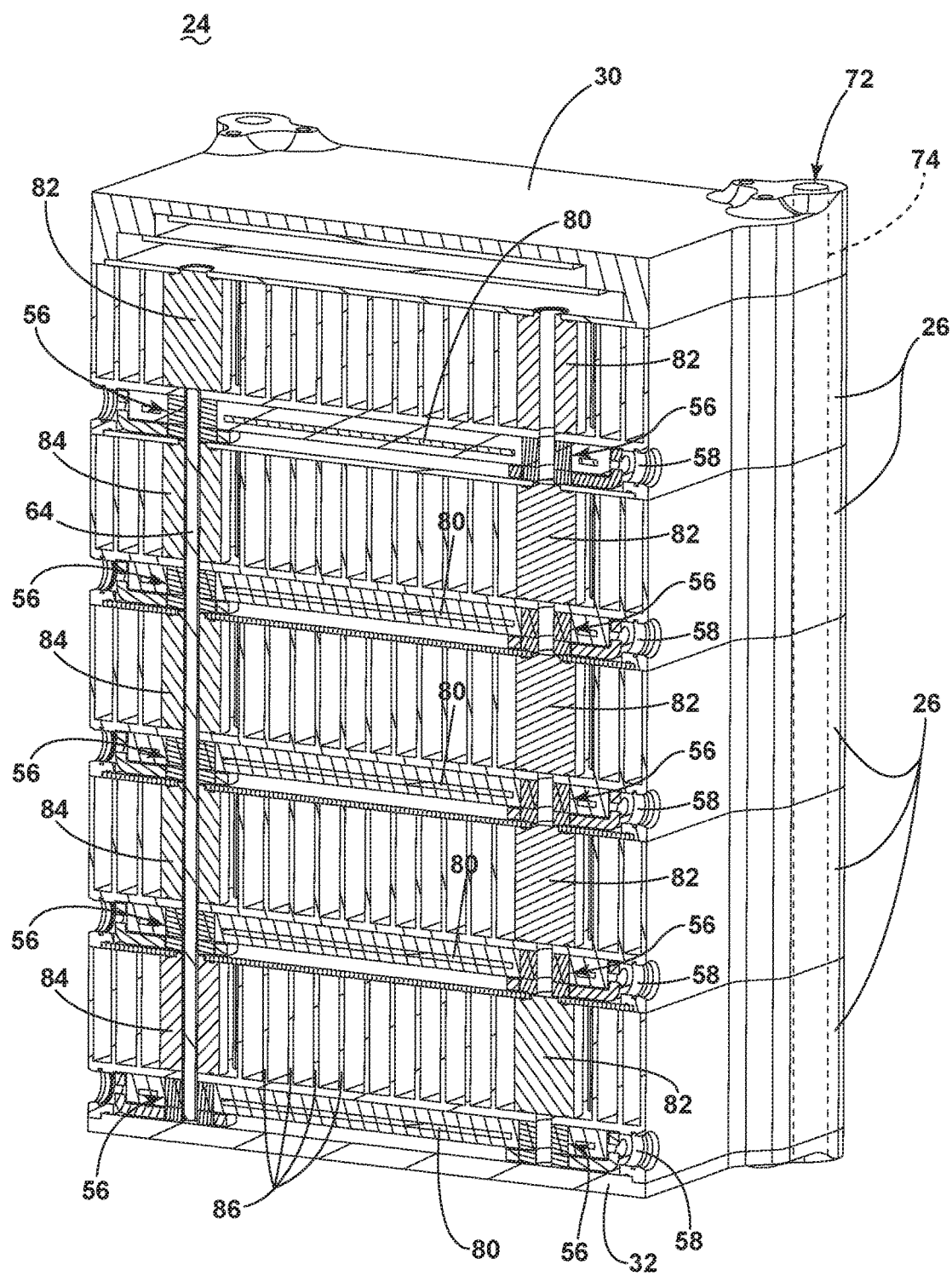
FIG. 4 is an isometric view of the assembled power distribution apparatus of FIG. 3, in accordance with various aspects described herein.

FIG. 4 illustrates an isometric view of the assembled power distribution apparatus 24 of FIG. 3. As shown, aspects of the disclosure can have the set of switching modules 26 include corresponding printed circuit boards 80, wherein the printed circuit boards 80 include, for example the switching elements 62 and any other power electronics, as needed.

Also shown are a set of stopper elements 82 and a set of pass-through elements 84, located in-line with and between the electrical power interfaces 56 of adjacent modules 26, 30. The stopper elements 82 can be configured to prevent a conductor 64 from passing between adjacent modules 26, 30 while the pass-through elements 84 can be configured to enable a conductor 64 to pass between adjacent modules 26, 30. The set of stopper elements 82 and pass-through elements 84 can be selected to enable the electrical coupling of adjacent modules 26, 30 by way of the electrical power interfaces 56, as desired. In one example configuration, the stopper element 82 can further be configured to retain, to restrain, to hold, or to prevent a conductor 64 from moving, sliding, or otherwise extending past a desired terminal end.

The illustrated aspects further illustrate that a subset of the modules 26, 30 can also optionally include a set of heat dissipation elements 86, including, but not limited to, thermal fins, heat pipes, and the like. The heat dissipation elements 86 can be configured to dissipate heat generated by, for example, the printed circuit boards 80 or power electronics. The optional heat dissipation elements 86 can be configured to enable cooling air or coolant to pass across the heat dissipation elements 86 as needed to enable a desired cooling process, a desired cooling profile, or desired operating conditions.

The selectability and configurability of the aspects described herein can define a modular power distribution apparatus 24 for distributing power from a power source (such as the generator 18) to a set of power output connectors 58 or to at least one electrical load 20 of, for example, an aircraft 10. A known set of electrical loads 20 in a portion of an aircraft 10 can define a predetermined or desired set of electrical outputs 58. Knowing the desired electrical outputs 58 and a set of power supplied by the power source, a set of power distribution nodes 16, power distribution apparatus 24, switching modules 26, or combination thereof can be selected to modify the power supplied by the power source to the desired electrical outputs 58. In this sense, the switching modules 26 are selectable or modular based at least in part on the power supplied and the desired electrical output.

Moreover, the arrangement of the common control module 30 and set of switching modules 26, the power distribution apparatus 24, or power distribution node 16, can be customized by selecting a desired arrangement of modules 26, 30 appropriate for or corresponding to the number of electrical loads 20, power distribution requirements, or control of the power distribution network. In this sense, the arrangement modules 26, 30, power distribution apparatus 24, power distribution nodes 16, and the like, are selectable or modular based at least in part on the power supplied by the power source, or the previously described arrangements.

Figure 5:
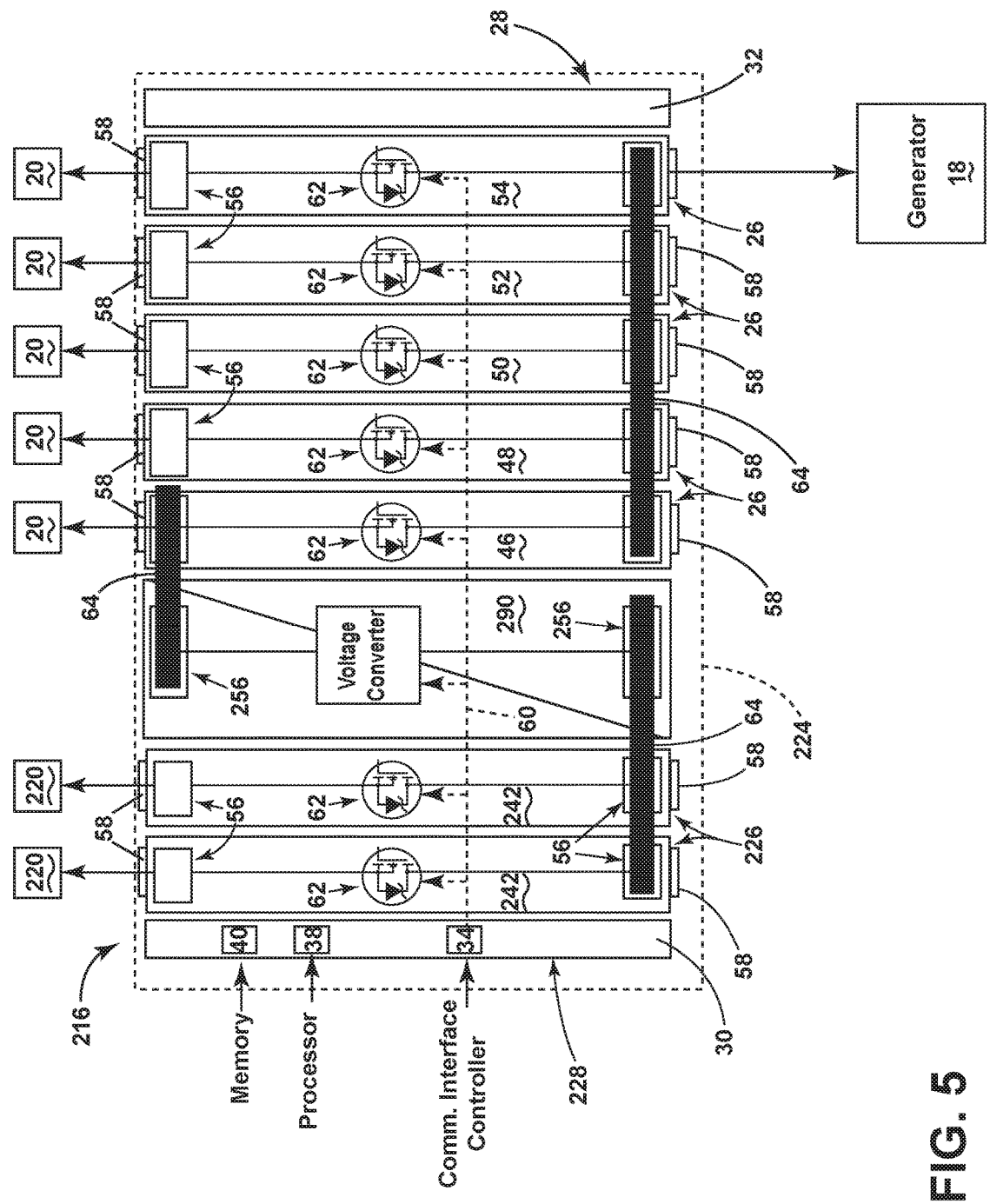
FIG. 5 is a schematic view of another power distribution node, in accordance with various aspects described herein.
Figure 6:
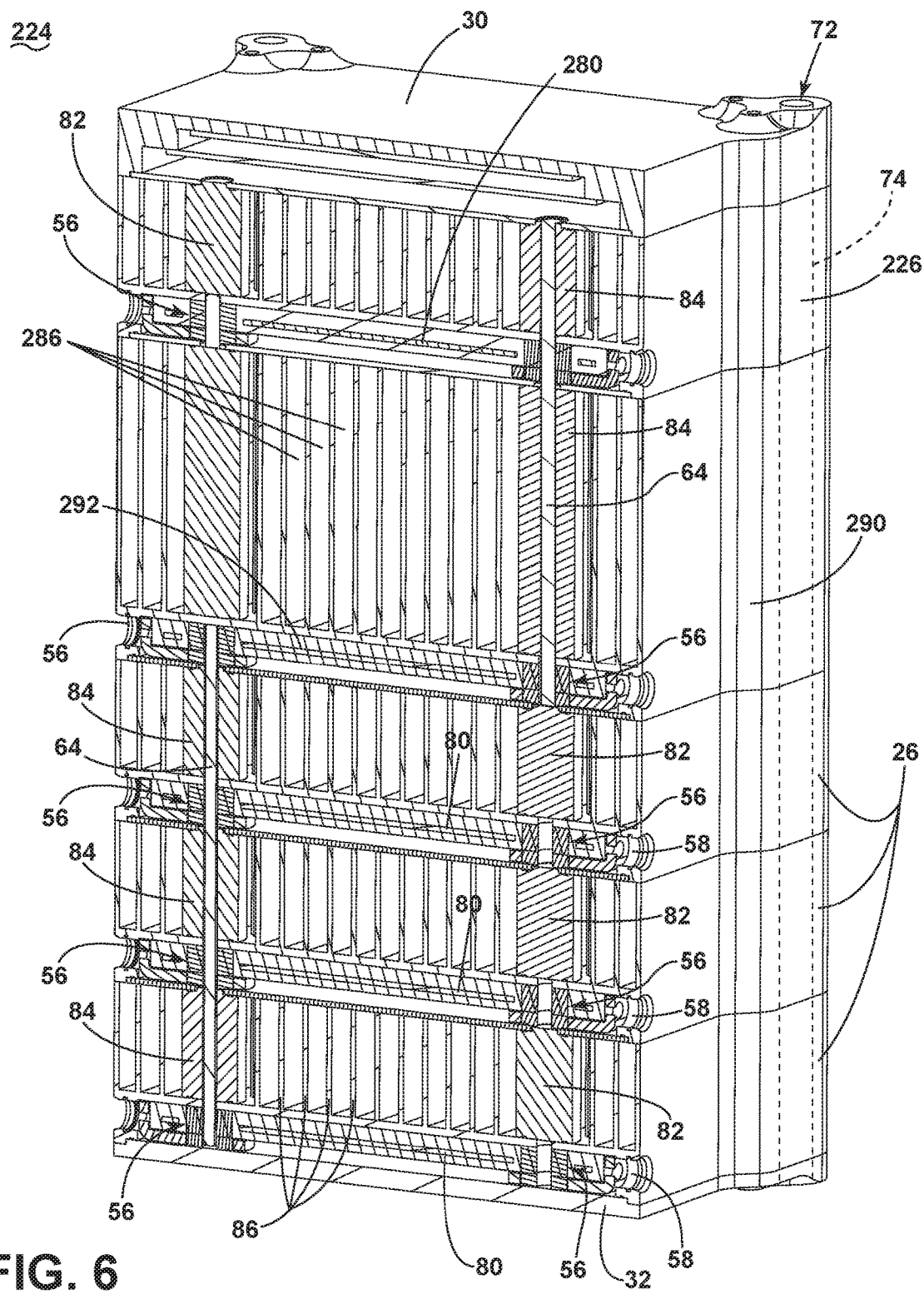
FIG. 6 is an isometric view of the assembled power distribution apparatus of FIG. 5, in accordance with various aspects described herein.

FIGS. 5 and 6 illustrate another power distribution node 216 according to another aspect of the present disclosure. The power distribution node 216 is similar to the power distribution node 16; therefore, like parts will be identified with like numerals increased by 200, with it being understood that the description of the like parts of the power distribution node 16 applies to the power distribution node 216, unless otherwise noted. Referring to FIG. 5, one difference is that the power distribution node 216 includes a voltage converter module 290, in addition to the set of switching modules 26, 226. The voltage converter module 290 can similarly include two electrical power interfaces 56 that are schematically illustrated at opposing longitudinal ends of the module 290, and configured to receive a similar conductor 64.

The conductor 64 can be selected to enable, for instance, an electrical connection between the electrical power interface 56 of the respective module 242, 244, 46, 48, 50, 52, 54, 290 to at least one electrical power interface 56 of another module 242, 244, 46, 48, 50, 52, 54, 290. For instance, as shown, one conductor 64 electrically connects respective electrical power interfaces 56 between the first and second switching modules 242, 244 and the voltage converter module 290. Likewise, another conductor 64 electrically connects respective electrical power interfaces 56 between the second, switching module 46 and the voltage converter module 290. Yet a third conductor 64 electrically connects respective power interfaces 56 between the third, fourth, fifth, sixth, and seventh switching modules 46, 48, 50, 52, 54. Length of the conductor 64 can be selected based on the desired configuration, that is, the desired electrical coupling of the set of modules 26, 226, 290.

The voltage converter module 290 can include power electronics components configured, for example, to provide or enable power conversion operations (e.g. AC to DC conversion, DC to AC conversion, a first DC power to a second DC power, step-up conversion, step-down conversion, etc.). In one non-limiting example configuration, the voltage converter module 290 can include a solid state power converter. In this sense, the power converter module 290 can receive a first power provided from, in one non-limiting example, the generator 18, by way of the conductors 64 and the third switching module 46, and convert it to a different power provided to the first and second switching modules 242, 244 by way of another conductor 64. Non-limiting examples of first and second power or first and second power characteristics can include 28 Volts DC or 270 Volts DC. In this sense, the power distribution node 216 can operably provide switching operations to a first set of electrical loads 20 operating at a first power characteristic (via the third, fourth, fifth, sixth, and seventh switching modules 46, 48, 50, 52, 54), and to a second set of electrical loads 220 operating at a second power characteristic, different from the first power characteristic (via the first and second switching modules 242, 244). The operable switching operations can selectively enable or disable the delivery of power to one or more particular electrical loads 20, 220, depending on, for example, available power distribution supply, criticality of electrical load functionality, or aircraft mode of operation, such as take-off, cruise, or ground operations.

Non-limiting aspects of the power distribution node 216 can be included wherein the power distribution apparatus 224 can be selectively or electrically coupled to additional power elements of the aircraft 10, such as another power distribution node 16, 216, set of power distribution nodes 16, 216, transmission line 22, or at least one power-supplying element, such as the generator 18, auxiliary power generator, emergency power supply, or combination thereof.

Non-limiting aspects of the power distribution node 216 can also be included wherein the voltage converter module 290 is controllably operable in response to a control signal from the common control module 30, processor 38, end module 228, communication interface 60, or combination thereof. While the voltage converter module 290 is shown having approximately double the volume compared with the switching modules 242, 244, 46, 48, 50, 52, 54, larger or smaller, or other comparable or relative size differences, can be included. Additionally, as illustrated, the power distribution node 216 can include a first set of switching modules 242, 244 electrically connected serially between the end module 28 and the voltage converter module 290, and a second set of switching modules 46, 48, 50, 52, 54 electrically connected serially between the voltage converter module 290 and the opposing end module 28. Additional non-limiting aspects of the disclosure can be included wherein, for example, only one set of switching modules 26, 226 can be included on a single side of the voltage converter module 290.

FIG. 6 illustrates an isometric view of an assembled power distribution apparatus 224 similar to that described in FIG. 5. As shown, aspects of the disclosure can be included the set of switching modules 26, 226 include corresponding printed circuit boards 80, 280, wherein the printed circuit boards 80, 280 include, for example the switching elements 62 and any other power electronics, as needed. The voltage converter module 290 can also include a voltage converter circuit board 292, including any power converter electronics, as needed. In yet another aspect of the disclosure, a set of switching modules 26, 226 can be connected serially, in parallel, or in a combination of serially and in parallel, relative to the power converter module 290.

The illustrated aspects further show that a subset of the modules 26, 30 can also optionally include a set of heat dissipation elements 86, including, but not limited to, thermal fins, heat pipes, and the like. As shown, the voltage converter module 290 can extend approximately double the length of the switching modules 26, 226 (e.g. in the direction of the attachment interface 72), and can include voltage converter heat dissipation elements 286 configured, capable of, or enabled to dissipate more heat, compared with the heat dissipation elements 86 of the switching modules 26, 226. The heat dissipation elements 86, 286 can be configured to dissipate heat generated by, for example, the printed circuit boards 80 or voltage converter circuit board 292. The optional heat dissipation elements 86, 286 can be configured to enable cooling air or coolant to pass across the heat dissipation elements 86, 286 as needed to enable a desired cooling process, a desired cooling profile, or desired operating conditions.

Non-limiting aspects of the disclosure can be included wherein, for instance, redundant voltage converter modules 290 can be included in one or more power distribution nodes 216 to account or adapt for inrush or overload currents. In another non-limiting example aspect, the voltage converter module 290 can be configured to selectively convert power bi-directionally, that is, to or from either of the first or second power characteristics to the other characteristic. In yet another non-limiting aspect, the voltage converter module 290 can be operably selected, controlled, sized, configured, or the like, to convert one kilowatt of power from the first power characteristic to the second power characteristic. In yet another non-limiting aspect, the quantity or amount of power conversion can be selected or controlled based on the cooling capabilities of the heat dissipation elements 286.

Figure 7:
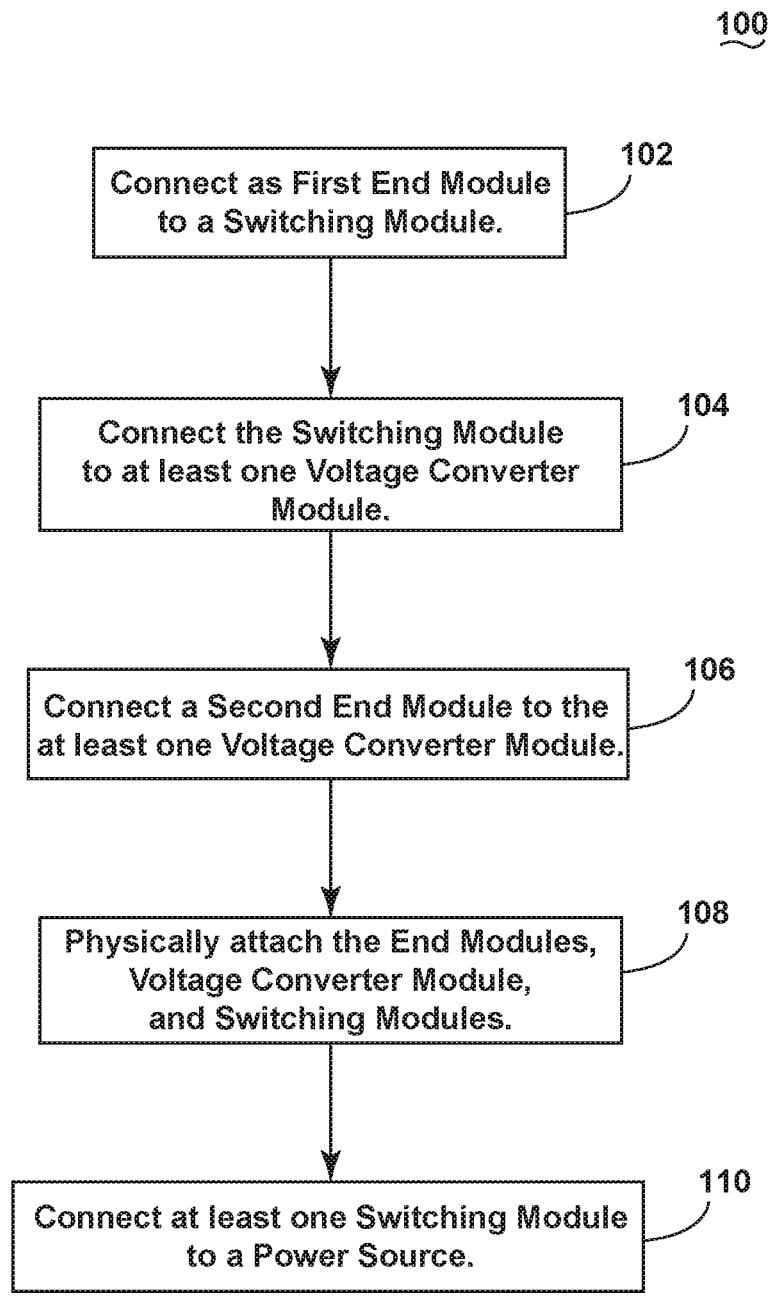
FIG. 7 is an example a flow chart diagram of a method of distributing power in an aircraft in accordance with various aspects described herein.

FIG. 7 illustrates a flow chart demonstrating a method 100 of distributing power in a power distribution system such as in an aircraft 10. The method 100 begins by connecting at least one first end module having at least one of an end module communication interface, a power supply, or a processor to at least one switching module having a switching module electrical power interface and having at least one of a switching element, an input/output connector, a switching module communication interface, or a bus bar connector by connecting the end module electrical power interface to the switching module electrical power interface at 102. The method 100 then proceeds to connect the at least one switching module to at least one voltage converter module having a voltage converter module electrical power interface by connecting the switching electrical power interface to voltage converter module electrical power interface at 104.

Next, the method 100 connects at least one second end module to the at least one voltage converter module or at least one other switching module at 106. The method 100 then includes physically attaching in one or two axes the at least one first end module to the at least one switching module, and the at least one switching module to the at least one voltage converter module, and the at least one voltage converter module or at least one other switching module to the at least one second end module by way of an attachment interface on each module at 108. Finally, the method 100 connects the at least one switching module to a power source. The method can then optionally operate the common control module and switching modules as described herein.

The sequence depicted is for illustrative purposes only and is not meant to limit the method 100 in any way as it is understood that the portions of the method can proceed in a different logical order, additional or intervening portions can be included, or described portions of the method can be divided into multiple portions, or described portions of the method can be omitted without detracting from the described method. For example, the connecting of the at least one switching module to at least one other switching module at 104 can further includes selecting an order for disposition of the switching modules or solid state power controllers.

Many other possible aspects and configurations in addition to that shown in the above figures are contemplated by the present disclosure. For example, one aspect of the disclosure contemplates a configuration wherein both end modules 28 can include common control modules 30 to enable, for example, redundancy in controlling the switching modules. Additionally, any number of switching modules 26 can be included in a power distribution node 16 or a power distribution apparatus 24, and can be arranged or assembled based on like power distribution requirements such as AC or DC power, like power outputs such as voltage levels, electrical load 20 criticality, load or current balancing such as current draw, or the like. In another example configuration, a set or subset of the switching modules can be electrically arranged in parallel to perform additional or alternative power distribution or switching operations. In yet another configuration, the input/output connectors 58 can be selectively enabled or configured to only operate in one of input or output mode. In another non-limiting aspect, one or more voltage converter modules 290 can be directly connected with an electrical output or electrical load 20, 220. Similarly, in another non-limiting aspect, one or more voltage converter modules 290 can be directly connected with a power input, such as a generator 18.

In yet another configuration, the common control module 30 can further receive instructions or control signals from additional systems, including emergency systems, aircraft control systems, fault system identifiers, and the like. In yet another configuration, the physical configuration of the set of modules 26, 30 can be keyed or arranged such that the power distribution apparatus 24 can only be correctly coupled, assembled, or operated in a single known arrangement to prevent incorrect assembly or operation. For example, at least one of the common attachment 74 or the communicative bus tabs 70 can be keyed or arranged to provide a known assembly orientation. In yet another configuration, the above-described configuration of the two switching modules 26 providing the bi-directional or bi-polar switch can be substituted with a single switching module 26 configured to provide bi-directional or bi-polar switching between the power distribution node 16 or power distribution assembly 24 and the greater power distribution network. In yet another aspect of the disclosure, the common control module 30 of a first power distribution apparatus 24 can be communicatively coupled with at least one other common control module 30 of at least another power distribution apparatus 24 such that the power distribution network can share control, awareness, statuses, or errors across the network.

The aspects disclosed herein provide a method and apparatus for distributing power in a power distribution network by assembling a modular and scalable power distribution and conversion apparatus. The technical effect of the above-described aspects is that a modular power distribution node or apparatus can be designed, as needed or on-demand, to operate power switching functions to electrical loads, or power converting and further switching functions, as described herein. One advantage that can be realized in the above aspects is that the tailoring to the particularized power distribution needs can reduce the number of unnecessary components included in the distribution node. Furthermore, the power distribution apparatus itself can be selected to only provide a limited number of power outputs, including dissimilar power output characteristics (via the power converter module) tailored to the expected number of electrical loads required for particular node operations. Thus, aspects of the disclosure enable an optimized component size and power conversion operations per node installation. By reducing the number of components and reducing the total installation node volume, the above-described aspects of the disclosure have superior weight and size advantages over the conventional power distribution systems.

Another advantage to the above-described aspects is that by reducing the number of unnecessary components can reduce the cost for the power distribution assembly or node. Moreover, a decreased number of parts as the system will make the distribution system, power distribution apparatus, or node inherently more reliable. Yet another advantage to the above-described aspects is that the smaller installation volume of the power distribution assembly can allow for the installation of the assembly closer to the electrical loads being serviced by the node. This closer proximity results in a reduction of interconnecting transmission wire lengths with the assembly output, and hence a corresponding weight reduction due to wiring. The power converting functionality can further allow for installation of the assembly closer to the electrical loads without having to include external power converting apparatus. The power converting functionality can further be tailored by utilizing smaller converters in the system, to minimize over-supply at a disposed location, while allowing minimal cooling due to smaller power conversion. Furthermore, by utilizing smaller converters, redundancies in power conversion can be included with less disruption, volume required, or heat requirements.

Yet additional advantages can include minimized wire weight due to proximity of the power distribution node to the electrical loads, greater flexibility in design and utilization of power electronics, modular construction, and reusable modules resulting in reduced engineering, development, testing, and validation efforts and costs.

When designing aircraft components, important factors to address are size, weight, and reliability. The above described power distribution apparatus results in a lower weight, smaller sized, increased performance, and increased reliability system. The lower number of parts and reduced maintenance will lead to a lower product costs and lower operating costs. Reduced weight and size correlate to competitive advantages during flight.

To the extent not already described, the different features and structures of the various aspects may be used in combination with each other as desired. That one feature may not be illustrated in all of the aspects is not meant to be construed that it may not be, but is done for brevity of description. Thus, the various features of the different aspects may be mixed and matched as desired to form new aspects, whether or not the new aspects are expressly described. All combinations or permutations of features described herein are covered by this disclosure.

This written description uses examples to disclose aspects of the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What we claim is:

1. A modular power distribution apparatus comprising:
    a first end module and a second end module, at least one of the first or second end modules having at least one of an end module communication interface, a power supply, or a processor;
    at least one switching module having a switching module electrical power interface configured to electrically connect to another switching module electrical power interface, and having at least one of a switching element, an input/output connector, a switching module communication interface, or a bus bar connector; and
    at least one voltage converter module having an electrical power interface configured to electrically connect to at least one switching module electrical power interface, another voltage converter module electrical power interface, or a bus bar connector;
    wherein at least a subset of the first end module, the second end module, the at least one switching module, and the at least one voltage converter module have an attachment interface configured to physically secure the at least one switching module and the at least one voltage converter module to and between the first end module and the second end module, or to another switching module or voltage converter module, with the at least one of the first or second end modules communicatively connected to the at least one switching module, and at least one of the switching element, input/output connector, the switching module communication interface, or the bus bar connector being selectively connected to at least one of the first end module, the second end module, another switching module, or the voltage converter module.

2. The modular power distribution apparatus of claim 1, wherein the voltage converter module is connected to the switching module communication interface.

3. The modular power distribution apparatus of either of claim 1, wherein the attachment interface includes a set of attachment points, and the set of attachment points among the first end module, the second end module, the at least one switching module, and the voltage converter module are in registry.

4. The modular power distribution apparatus of claim 1, wherein the switching element is a solid state power controller.

5. The modular power distribution apparatus of claim 1, wherein the attachment interface includes at least one of a locating pin or a seal.

6. The modular power distribution apparatus of claim 1, comprising a first set of switching modules electrically connected serially between the first end module and the voltage converter module, and a second set of switching modules electrically connected serially between the voltage converter module and the second end module.

7. The modular power distribution apparatus of claim 6, wherein the power converter module is configured to convert a first power supply received to a second power supply.

8. The modular power distribution apparatus of claim 7, wherein the first set of switching modules operably enable or disable the first power supply and the second set of switching modules operably enable or disable the second power supply.

9. The modular power distribution apparatus of claim 1, wherein the voltage converter module includes a solid state power converter.

10. A modular power distribution apparatus comprising:
    at least one first end module and at least one second end module, at least one of the first and second end modules having at least one of an end module communication interface or a processor;
    at least one switching module having a switching module electrical power interface configured to electrically connect to at least another switching module electrical power interface, and having at least one of a switching element, an input/output connector, a switching module communication interface, or a bus bar connector; and
    at least one voltage converter module having a voltage converter module electrical power interface to connect to at least another voltage converter power interface, at least one switching module electrical power interface, or a bus bar connector;
    wherein the first end module, the second end module, the at least one switching module, and the at least one voltage converter module have an attachment interface configured to physically secure the at least one switching module to at least one of the first or second end modules, between the first end module and the second end module, or to another switching module or voltage converter module, in one or more axes.

11. The modular power distribution apparatus of claim 10, wherein at least one of the first end modules has a communication interface or a processor and at least one of the second end modules is a physical cover.

12. The modular power distribution apparatus of either of claim 10, wherein the attachment interface includes a set of attachment points, and the set of attachment points among the at least one first end module, the at least one second end module, the at least one switching module, and at least one voltage converter module are in registry.

13. The modular power distribution apparatus of claim 10, wherein the voltage converter module is solid state.

14. The modular power distribution apparatus of claim 10, wherein the attachment interface includes at least one of a locating pin or a seal.

15. The modular power distribution apparatus of claim 10, comprising a first set of switching modules electrically connected serially or in parallel between the first end module and the voltage converter module, and a second set of switching modules electrically connected serially between the voltage converter module and the second end module.

16. The modular power distribution apparatus of claim 15, wherein the power converter module is configured to convert a first power supply received to a second power supply, and wherein the first set of switching modules operably enable or disable the first power supply and the second set of switching modules operably enable or disable the second power supply.

17. A method of distributing power in an aircraft, the method comprising;
    connecting at least one first end module having at least one of an end module communication interface, a power supply, or a processor to a at least one switching module having a switching module electrical power interface and having at least one of a switching element, an input/output connector, a switching module communication interface, or a bus bar connector by connecting the end module communication interface to the switching module communication interface;

connecting the at least one voltage converter module to the at least one other switching module having a voltage converter module electrical power interface by connecting the switching electrical power interface to the voltage converter module electrical power interface;

connecting at least one second end module to the at least one voltage converter module or at least one other switching module;

physically attaching in one or two axes the at least one first end module to the at least one switching module, and the at least one switching module to the at least one voltage converter module, and the at least one voltage converter module or at least one other switching module to the at least one second end module by way of an attachment interface; and connecting the at least one switching module to a power source.

18. The method of claim 17, wherein the attachment interface includes a set of attachment points, and the set of attachment points among the at least one first end module, at least one second end module, at least one switching module, and the at least one voltage converter module are in registry.

19. The method of claim 17, wherein at least one of the switching elements is a solid state power controller, and connecting the at least one switching module to at least one other switching module includes selecting an order for disposition of the solid state power controller.

20. The method of claim 17, wherein connecting the at least one switching module to at least one other switching module includes selectively connecting one bus bar connect to another to form an electronic distribution bus.

* * * * *